(12) United States Patent
Schittenhelm et al.

(10) Patent No.: US 10,035,698 B2
(45) Date of Patent: Jul. 31, 2018

(54) GETTER DEVICE FOR A MICROMECHANICAL COMPONENT

(71) Applicant: Robert Bosch GmbH, Stuttgart (DE)

(72) Inventors: Nicole Schittenhelm, Reutlingen (DE); Carsten Geckeler, Tuebingen (DE); Sebastian Guenther, Tuebingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 15/379,017

(22) Filed: Dec. 14, 2016

(65) Prior Publication Data

US 2017/0183220 A1    Jun. 29, 2017

(30) Foreign Application Priority Data

Dec. 29, 2015 (DE) .................... 10 2015 226 772

(51) Int. Cl.
*B81B 7/00* (2006.01)
*B81C 1/00* (2006.01)
*B81B 7/02* (2006.01)

(52) U.S. Cl.
CPC .......... *B81B 7/0038* (2013.01); *B81B 7/02* (2013.01); *B81C 1/00285* (2013.01); *B81B 2201/0235* (2013.01); *B81B 2201/0242* (2013.01); *B81C 2203/0163* (2013.01)

(58) Field of Classification Search
CPC .......... B81B 7/0038; B81C 1/00285; B81C 1/00238; B81C 2203/0118; H01L 21/3225; H01L 23/26; H01J 2211/52; H01J 29/94
USPC ........................................................ 257/467
See application file for complete search history.

(56) References Cited

U.S. PATENT DOCUMENTS

| | | | |
|---|---|---|---|
| 2007/0188075 A1* | 8/2007 | Kimiya | H01J 1/46 313/495 |
| 2008/0012466 A1* | 1/2008 | Yang | B82Y 10/00 313/495 |
| 2008/0213539 A1* | 9/2008 | Souriau | B81C 1/00285 428/156 |
| 2010/0001361 A1* | 1/2010 | Caplet | B81B 7/0038 257/467 |
| 2011/0030989 A1* | 2/2011 | Baillin | B81C 1/00293 174/50 |
| 2014/0225206 A1* | 8/2014 | Lin | B81B 7/0038 257/417 |

* cited by examiner

*Primary Examiner* — Jonathan Han
(74) *Attorney, Agent, or Firm* — Norton Rose Fulbright US LLP; Gerard Messina

(57) ABSTRACT

A getter device for a micromechanical component, having a metallic getter structure that is situated in a cavity of the micromechanical component. The getter structure is heatable using a defined electric current. It is possible to evaporate the material of the getter structure in a defined manner.

10 Claims, 1 Drawing Sheet

GETTER DEVICE FOR A MICROMECHANICAL COMPONENT

CROSS REFERENCE

The present application claims the benefit under 35 U.S.C. § 119 of German Patent Application No. DE 102015226772.5 filed on Dec. 29, 2015, which is expressly incorporated herein by reference in its entirety.

FIELD

The present invention relates to a getter device for a micromechanical components. Furthermore, the present invention relates to a method for manufacturing a getter device for a micromechanical component.

BACKGROUND INFORMATION

MEMS rotation-rate sensors (microelectromechanical systems) require a high mechanical quality of the mechanical MEMS element. Said quality is essentially defined by an internal pressure in the MEMS cavity. Because of friction between a residual gas and a mechanical oscillator structure, energy is continuously drawn from the system, which limits the maximum quality in the mechanical system.

In order to set a low internal pressure (i.e., a high quality of the sensor), sensor wafer and cap wafer are bonded in a chamber under a desired internal pressure. This method offers the possibility of setting internal pressures greater than approx. 1 mbar. Residual gas and degassing of the surface limit the achievable minimum pressure.

In a conventional method, it is possible to reduce the internal pressure with the aid of a pasty getter material that is applied in a planar manner in the cap of the rotation-rate sensor, and which is chemically activated. This method is used in combination MEMS systems (having two separate cavities, for example rotation-rate sensor and acceleration sensor) in order to provide a low pressure for the rotation-rate sensor and at the same time a higher pressure for the acceleration sensor. The sensor wafer and the cap wafer are bonded at the target pressure of the acceleration sensor. In this manner, the required internal pressure is set for the acceleration sensor. The getter material in the cap wafer then binds the residual gas in the rotation-rate sensor cavity. It is thus possible to reduce the required internal pressure in the rotation-rate sensor to approx. 1 mbar.

Conventional macroscopically developed vacuum systems are furthermore available, in which getter pumps are used with metallic getter materials (for example titanium), a residual gas being gettered away by evaporating the getter material and a vacuum being thereby produced.

SUMMARY

An objective of the present invention is to provide an improved getter device for a micromechanical component.

According to a first aspect of the present invention, the objective is achieved by a getter device for a micromechanical component, having:

a metallic getter structure that is situated in a cavity of the micromechanical component;

the getter structure being heatable using a defined electric current, it being possible to evaporate the material of the getter structure in a defined manner.

According to a second aspect, the objective is achieved by a method for manufacturing a getter device for a micromechanical component, having the steps:

providing a metallic getter structure, which is controllable using a defined electric current, it being possible to evaporate the getter structure in a defined manner by the control process using the defined electric current; and disposing the metallic getter structure in a cavity of the micromechanical component.

Preferred specific embodiments of the getter device for a micromechanical component are described herein.

One advantageous development of the getter device includes that the getter structure is disposed in the cavity of the micromechanical component in a self-supporting manner. In this manner, the getter structure is able give of the getter material very well to the surroundings in the cavity during the evaporation.

Another advantageous development of the getter device includes that the getter structure is disposed in the cavity of the micromechanical component on a supporting structure. This advantageously improves a mechanical stability of the getter structure, which allows for a long operational life of the micromechanical component.

One advantageous development of the getter device is characterized by the fact that the supporting structure of the micromechanical component is an Si structure. This advantageously makes it possible to use already existing material of the micromechanical component for a supporting element of the getter structure. A mechanical construction of the getter device is thereby advantageously simplified.

Another advantageous development of the getter device provides for the getter structure to be thermally insulated. This makes it possible to heat up the getter structure more quickly and with less expenditure of electric energy. Moreover, this advantageously makes it possible to keep an operating temperature of the micromechanical component low because a thermal connection of the getter structure to the micromechanical component is minimized.

Additional advantageous developments of the getter device are include that the getter structure is disposed in the region of a sensor wafer or in the region of a cap wafer of the micromechanical component. This provides alternatives for the disposition of the getter structure, it being possible to take local conditions of the sensor wafer and of the cap wafer into consideration.

Additional advantageous developments of the getter device include that the material of the getter structure is at least one of the following: aluminum, barium, calcium, cerium, magnesium, niobium, phosphor, strontium, tantalum, terbium, thorium, titanium, zirconium. In this manner, different materials are available for a getter process, it being possible with knowledge of the properties of the materials to set an internal pressure of the cavity of the micromechanical component very precisely.

The present invention is described below in detail with additional features and advantages with reference to two figures. For this purpose, all features form the subject matter of the present invention, irrespective of their presentation in the specification and in the figures. The figures are intended in particular to elucidate main principles of the present invention and are not necessarily drawn true to scale and detail.

Disclosed device features result analogously from corresponding disclosed method features and vice versa. This means in particular that features, technical advantages and embodiments relating to the getter device for the micromechanical component analogously result from corresponding embodiments, features and advantages relating to the method for manufacturing a getter device for a micromechanical component and vice versa.

DETAILED DESCRIPTION OF EXAMPLE EMBODIMENTS

Figure 1:
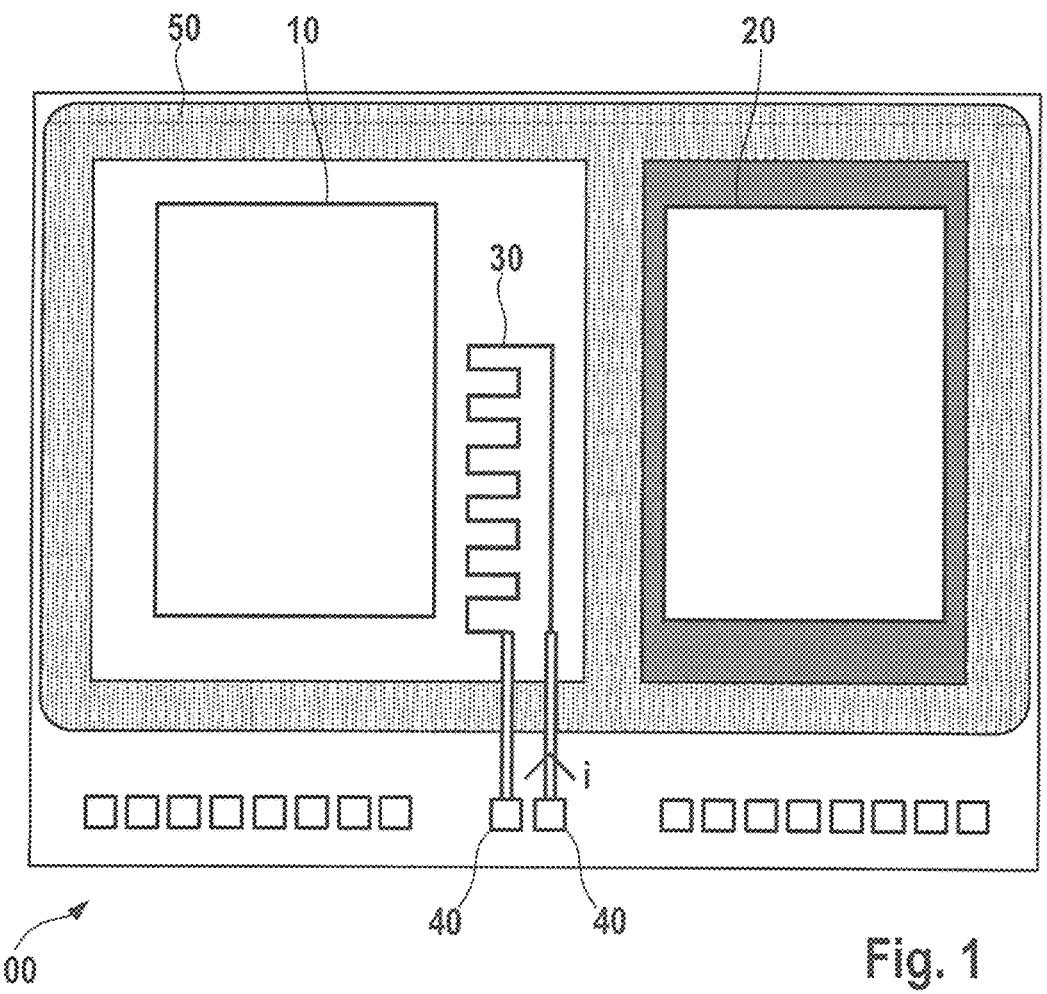
FIG. 1 shows a specific embodiment of a getter device for a micromechanical component.

FIG. 1 shows a top view of a micromechanical component 100 with a first specific embodiment of a getter device 30 for micromechanical component 100. The micromechanical component 100 is developed in this instance as an inertial sensor having a rotation-rate sensor 10 and an acceleration sensor 20. A bonding frame separates cavities of rotation-rate sensor 10 and acceleration sensor 20 from one another. Getter device 30 is developed as a self-supporting or free-standing metallic getter structure in a cavity of the rotation-rate sensor 10, which is heated using an electric control current i and which thereby evaporates getter material in the cavity of the rotation-rate sensor in a defined manner. The electric control current i is supplied via electric terminals 40 of micromechanical component 100. Due to the flow of current through the metallic getter material of the getter structure, the latter is heated, evaporates in the further course and is able to spread evenly in the cavity. As a result, the getter layer of the getter structure absorbs the residual gas in the sensor and reduces in this manner the internal pressure in the cavity. This makes it possible to set an internal pressure in the cavity of rotation-rate sensor 10 in a suitable manner.

In order to achieve a high temperature in the range of an evaporating point (approx. 1000° C.) of the getter material, the latter is preferably built up in a manner that is thermally insulated as much as possible. This may be achieved by the following design:

The getter material is applied on a free-standing silicon structure (for example a U-shaped conductor track).

The getter material is structured in a free-standing manner in the sensor area. This may be done, e.g., by application on an oxide and subsequent removal of the oxide, whereby a free-standing getter structure is produced. This is able to improve a mechanical stability of the getter structure. Using conventional micromechanical structuring processes, it is possible to produce the mentioned supporting structure, e.g., from an Si material in a simple manner.

The mentioned thermal insulation of the getter structure vis-a-vis the surroundings advantageously promotes the result that less electric energy is required for heating getter device 30 and that the heating process may thus be carried out more quickly. Furthermore, this also advantageously results in less thermal energy being given off to micromechanical component 100 and that the latter therefore is able to maintain a lower operating temperature.

The getter structure may be disposed both in the region of the sensor wafer as well as in the region of the cap wafer.

The getter structure is preferably developed from a metal, suitable metallic materials for the getter structure being for example at least one of the following: aluminum (Al), barium (Ba), calcium (Ca), cerium (Ce), magnesium (Mg), niobium (Nb), phosphor (P), strontium (Sr), tantalum (Ta), terbium (Tb), thorium (Th), titanium (Ti), zirconium (Zr). It is also conceivable to provide alloys of the mentioned materials as a material for the getter structure.

For carrying out the getter process, an electric current having a defined signal form (e.g., current pulse, alternating signal, direct-current signal) is driven through the getter structure. A signal form of the electric current and a duration of the electric current flow are suitably dimensioned in order to achieve a desired getter effect.

It is advantageously possible for example to drive an electric current pulse via an ASIC in the finished micromechanical component 100 or through micromechanical component 100 already at the wafer stage so that the introduction of the defined internal pressure in the cavity may be performed at different stages of the manufacture of micromechanical component 100. This advantageously optimizes production processes.

Advantageously, getter device 30 makes it possible to perform the getter process once or, if needed, multiple times, for example at the beginning or also in the interim during the operational life of the micromechanical sensor device. In this manner, it is advantageously possible to perform a follow-up gettering as needed. This may occur for example in that a detection of the internal pressure of a sensor cavity is provided (not shown), which may be used as a feedback loop for controlling gettering device 30. In the event that the internal pressure is too low, gettering is performed.

In this manner it is possible to compensate for possible changes of the internal pressure over a service life of the sensor even subsequently by a renewed distribution or evaporation of the getter material.

Advantageously, the getter device 30 according to the present invention makes it possible to perform a separate setting of different pressures in a cavity of a rotation-rate sensor and in a cavity of an acceleration sensor on a chip.

It is regarded as particularly advantageous that in contrast to conventional methods, a more precise setting of the internal pressure and thus a reduction of the quality fluctuation of the micromechanical sensor is achievable via the wafer. This may be explained by the fact that the conventional method is a chemical, thermally activated getter method using a pasty getter material that is performed once, whereas the provided method provides for a specific conduction of the control current i through the getter structure and in this manner allows for a fine adjustment of the internal pressure in the cavity.

Figure 2:
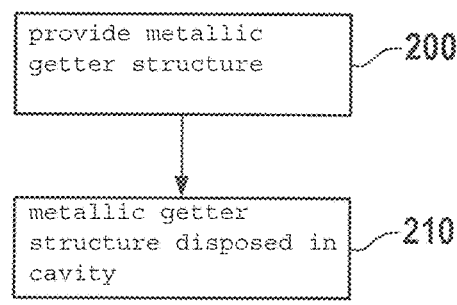
FIG. 2 shows a basic sequence of a specific embodiment of a method for manufacturing a getter device for a micromechanical component.

FIG. 2 shows a basic flow chart of a specific embodiment of the method of the present invention for manufacturing a getter device for a micromechanical component.

In a step 200, a metallic getter structure is provided, which is controllable using a defined electric current, it being possible to evaporate the getter structure in a defined manner by the control process using the defined electric current.

In a step 210, the metallic getter structure is disposed in a cavity of the micromechanical component 100.

In summary, the present invention provides a getter device or a getter pump for a micromechanical component and a method for its manufacture, which advantageously allows for a fine setting of an internal pressure in a cavity of a micromechanical sensor of an inertial sensor. Because the process is controlled by an electric current, a getter process may be performed with a defined frequency, which advantageously makes it possible to increase a quality or sensing quality of the micromechanical component over the operational life.

Although the present invention is described herein in connection with micromechanical inertial sensors, it is of course also applicable to other micromechanical components. One skilled in the art will thus also implement specific embodiments that are not expressly described, or only partially described, above, without deviating from the core of the present invention.

What is claimed is:

1. A getter device for a micromechanical component, comprising:
   a getter material and a getter structure situated in a cavity of the micromechanical component, and which is controllable by a control using a defined electric current;
   wherein the getter material or the getter structure is heatable using a defined electric current, the getter material on the getter structure being evaporable so as to spread in the cavity by the control using the defined electric current, and
   wherein a getter material on the getter structure is at least one of the following: aluminum, barium, calcium, cerium, magnesium, niobium, phosphor, strontium, tantalum, terbium, thorium, titanium, and zirconium, and
   wherein a getter material is on the getter structure, which is a free-standing silicon structure, and wherein the getter material is structured in a free-standing manner in a sensor wafer and/or in a region of a cap wafer.

2. The getter device as recited in claim 1, wherein the getter material is disposed in the cavity of the micromechanical component in a self-supporting manner.

3. The getter device as recited in claim 1, wherein the getter material is disposed in the cavity of the micromechanical component on a supporting structure.

4. The getter device as recited in claim 3, wherein the supporting structure of the micromechanical component is an Si structure.

5. The getter device as recited in claim 1, wherein the getter material and the getter structure is thermally insulated.

6. The getter device as recited in claim 1, wherein the getter material is disposed in the region of a sensor wafer or in the region of a cap wafer of the micromechanical component.

7. A method for manufacturing a getter device for a micromechanical component, comprising:
   providing a getter material on a getter structure that is controllable using a defined electric current, the getter material on the getter structure being evaporable so as to spread in a cavity by the control using the defined electric current; and
   disposing the getter material in the cavity of the micromechanical component;
   wherein the getter material of the getter structure is at least one of the following: aluminum, barium, calcium, cerium, magnesium, niobium, phosphor, strontium, tantalum, terbium, thorium, titanium, and zirconium,
   wherein a getter material is applied on the getter structure, which is a free-standing silicon structure, and wherein the getter material is structured in a free-standing manner in a sensor wafer and/or in a region of a cap wafer, and
   wherein a defined internal pressure is provided in a cavity at different stages of the manufacture of the micromechanical component.

8. The method as recited in claim 7, wherein the getter material is disposed in the cavity of the micromechanical component in a self-supporting manner.

9. The method as recited in claim 7, wherein the getter material is disposed in the cavity of the micromechanical component on a supporting structure.

10. The method as recited in claim 7, wherein the getter material is disposed in the region of the sensor wafer or in the region of the cap wafer of the micromechanical component.

* * * * *